(12) United States Patent
Liu et al.

(10) Patent No.: US 8,571,510 B2
(45) Date of Patent: Oct. 29, 2013

(54) HIGH LINEARITY LOW NOISE RECEIVER WITH LOAD SWITCHING

(75) Inventors: Li Liu, San Diego, CA (US); Prasad S. Gudem, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 1004 days.

(21) Appl. No.: 12/193,695

(22) Filed: Aug. 18, 2008

(65) Prior Publication Data
US 2010/0041359 A1    Feb. 18, 2010

(51) Int. Cl.
*H04B 1/18*    (2006.01)
*H04B 1/26*    (2006.01)
*H04B 1/28*    (2006.01)

(52) U.S. Cl.
USPC ........... 455/313; 455/293; 455/311; 455/323; 455/333; 455/341

(58) Field of Classification Search
USPC .................. 455/293, 311, 313–326, 333, 341
See application file for complete search history.

(56) References Cited

U.S. PATENT DOCUMENTS

| | | | |
|---|---|---|---|
| 5,513,386 A | | 4/1996 | Ogino et al. |
| 5,805,988 A | * | 9/1998 | Clayton et al. ................ 455/333 |
| 6,442,382 B1 | * | 8/2002 | Busking ........................ 455/266 |
| 6,754,478 B1 | * | 6/2004 | Lee et al. .................... 455/232.1 |
| 6,801,760 B2 | | 10/2004 | Hutchison et al. |
| 7,085,549 B2 | * | 8/2006 | Peterson et al. .............. 455/323 |
| 7,120,410 B2 | | 10/2006 | Shi |
| 7,184,739 B2 | * | 2/2007 | Igarashi et al. ............... 455/313 |
| 7,266,361 B2 | * | 9/2007 | Burdett ......................... 455/334 |
| 7,356,317 B2 | * | 4/2008 | Xu et al. ....................... 455/130 |
| 7,386,290 B2 | * | 6/2008 | Li et al. ........................ 455/293 |
| 7,457,606 B2 | * | 11/2008 | Kim .............................. 455/323 |
| 7,486,942 B2 | * | 2/2009 | Sakurai ......................... 455/314 |
| 7,956,666 B2 | * | 6/2011 | Chou et al. .................... 327/355 |
| 8,149,955 B2 | * | 4/2012 | Tired ............................ 375/318 |
| 2002/0098820 A1 | | 7/2002 | Dijkmans et al. |

(Continued)

FOREIGN PATENT DOCUMENTS

| | | |
|---|---|---|
| CN | 1419744 A | 5/2003 |
| CN | 1677878 A | 10/2005 |

(Continued)

OTHER PUBLICATIONS

International Search Report and the Written Opinion—PCT/US2009/054214, International Search Authority—European Patent Office—Jan. 29, 2010.

*Primary Examiner* — Simon Nguyen
(74) *Attorney, Agent, or Firm* — S. Hossain Beladi

(57) ABSTRACT

A receiver includes a low noise amplifier (LNA) and multiple pairs of mixers. The LNA receives and amplifies an LNA input signal and provides at least one LNA output signal. Each pair of mixers downconverts one of the at least one LNA output signal when enabled. Each pair of mixers may be selectively enabled or disabled, e.g., based on a mode selected from among multiple modes. In one design, the LNA includes multiple load sections coupled in parallel. Each load section may be selectively enabled or disabled, e.g., based on the selected mode. In one design, first and second pairs of mixers and first and second load sections may be enabled for a high linearity mode. The first pair of mixers and the first load section may be enabled and the second pair of mixers and the second load section may be disabled for a low linearity mode.

37 Claims, 9 Drawing Sheets

(56) References Cited

U.S. PATENT DOCUMENTS

| | | |
|---|---|---|
| 2003/0064695 A1 | 4/2003 | Shi |
| 2003/0109241 A1* | 6/2003 | Kim ............................ 455/324 |
| 2003/0130006 A1* | 7/2003 | Reynolds ...................... 455/550 |
| 2003/0186669 A1 | 10/2003 | Yamawaki et al. |
| 2005/0101280 A1* | 5/2005 | Behzad ......................... 455/293 |
| 2006/0284679 A1* | 12/2006 | Roine ........................... 330/253 |
| 2007/0072575 A1* | 3/2007 | Sowlati et al. ............... 455/318 |
| 2007/0111661 A1* | 5/2007 | Bargroff et al. ............. 455/13.3 |
| 2007/0216482 A1 | 9/2007 | Hollenbeck et al. |
| 2007/0264958 A1* | 11/2007 | Lin ............................... 455/318 |
| 2008/0043818 A1* | 2/2008 | Tal et al. ...................... 375/135 |
| 2008/0139159 A1* | 6/2008 | Ojo et al. ..................... 455/313 |
| 2008/0284487 A1* | 11/2008 | Pullela et al. ................ 327/355 |
| 2009/0004992 A1* | 1/2009 | Tomiyama .................... 455/307 |
| 2009/0124223 A1* | 5/2009 | Kyranas et al. ............... 455/143 |
| 2009/0131007 A1* | 5/2009 | Molnar et al. ................ 455/320 |
| 2009/0191833 A1* | 7/2009 | Kaczman et al. ............. 455/296 |

FOREIGN PATENT DOCUMENTS

| | | |
|---|---|---|
| EP | 1528667 A2 | 5/2005 |
| EP | 1753236 A1 | 2/2007 |
| JP | 4346523 A | 12/1992 |
| JP | 2001511321 | 8/2001 |
| JP | 2005295348 | 10/2005 |
| JP | 2006066714 A | 3/2006 |
| JP | 2006311623 A | 11/2006 |
| TW | 200803152 | 1/2008 |
| WO | 9831108 A2 | 7/1998 |
| WO | WO2006109296 | 10/2006 |

\* cited by examiner

HIGH LINEARITY LOW NOISE RECEIVER WITH LOAD SWITCHING

BACKGROUND

I. Field

The present disclosure relates generally to electronics, and more specifically to a receiver for wireless communication.

II. Background

Receivers are widely used in various wireless communication systems to condition (e.g., amplify, filter, and downconvert) radio frequency (RF) received signals and provide baseband signals. Receivers are typically required to meet various linearity and noise requirements, which may be stringent for some wireless communication systems. A receiver may be designed with many reactive components (e.g., inductors) and with high bias current in order to meet the stringent linearity and noise requirements under worst-case operating conditions. The reactive components may increase the size and cost of the receiver, and the high bias current may increase power consumption, all of which are undesirable.

SUMMARY

A receiver having good linearity and noise performance is described herein. In one design, the receiver includes a low noise amplifier (LNA) and multiple pairs of mixers having their outputs coupled together. The LNA receives and amplifies an LNA input signal and provides at least one LNA output signal. Each pair of mixers includes one mixer for inphase (I) component and another mixer for quadrature (Q) component. The multiple pairs of mixers may be implemented with transistors of the same or different sizes, biased with the same or different amounts of current, biased with the same or different bias voltages, and driven with local oscillator (LO) signals of the same or different signal levels. Each pair of mixers downconverts one of the at least one LNA output signal when enabled. Each pair of mixers may be selectively enabled or disabled, e.g., based on a mode selected from among multiple modes.

In one design, the multiple modes include a high linearity mode that may be selected when a large jammer is detected and a low linearity mode that may be selected when a large jammer is not detected. First and second pairs of mixers may be enabled for the high linearity mode. The first pair of mixers may be enabled and the second pair of mixers may be disabled for the low linearity mode.

In one design, the LNA includes an input stage and an output stage and may be implemented with a single-ended or differential design. The input stage receives and amplifies the LNA input signal and provides an amplified signal, which may be either voltage or current. The output stage buffers the amplified signal and provides at least one LNA output signal. The output stage includes multiple load sections coupled in parallel. Each load section may be selectively enabled or disabled, e.g., based on the selected mode. Each load section may comprise a pair of P-channel metal oxide semiconductor (PMOS) transistors coupled to a pair of N-channel metal oxide semiconductor (NMOS) transistors and/or may comprise resistors. The multiple load sections may be implemented with transistors of the same or different sizes and may be biased with the same or different amounts of current.

In one design, the LNA provides multiple LNA output signals, and each pair of mixers downconverts a different LNA output signal when enabled. In one design, the LNA includes (i) a first load section that provides a first LNA output signal for a first pair of mixers and (ii) a second load section that provides a second LNA output signal for a second pair of mixers. Both load sections and both pairs of mixers may be enabled for the high linearity mode. The first load section and the first pair of mixers may be enabled and the second load section and the second pair of mixers may be disabled for the low linearity mode.

In general, an LNA may include any number of load sections, and a quadrature downconverter may include any number of pairs of mixers. More load sections, more pairs of mixers, and/or load sections and mixers with larger transistors may be selected when high linearity is desired. Fewer load sections, fewer pairs of mixers, and/or load sections and mixers with smaller transistors may be selected when high linearity is not needed in order to improve noise performance.

Various aspects and features of the disclosure are described in further detail below.

DETAILED DESCRIPTION

The receiver described herein may be used for various communication systems such as Code Division Multiple Access (CDMA) systems, Time Division Multiple Access (TDMA) systems, Frequency Division Multiple Access (FDMA) systems, Orthogonal FDMA (OFDMA) systems, Single-Carrier FDMA (SC-FDMA) systems, wireless local area networks (WLANs), broadcast systems, satellite positioning systems, etc. For clarity, certain aspects of the receiver are described below for a CDMA system.

Figure 1:
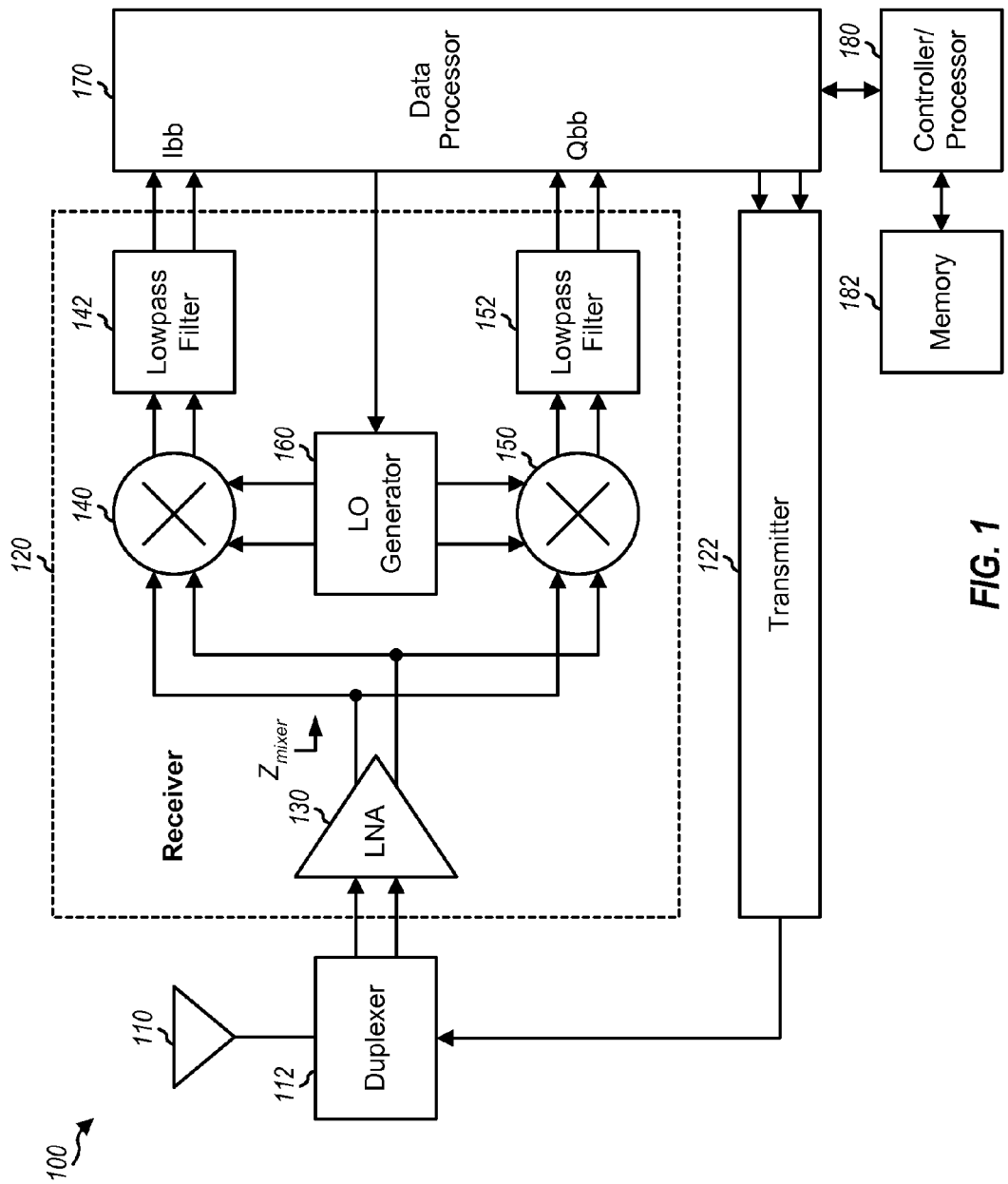
FIG. 1 shows a block diagram of a wireless device.

FIG. 1 shows a block diagram of a design of a wireless device 100, which includes a receiver 120 and a transmitter 122. In general, wireless device 100 may include any number of transmitters and any number of receivers for any number of communication systems and any number of frequency bands. A transmitter or a receiver may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF architecture, a signal is frequency converted between RF and baseband in one stage. The super-heterodyne and direct-conversion architectures may use different circuit blocks and/or have different requirements. In the design shown in FIG. 1, receiver 120 is implemented with the direct-conversion architecture.

On the receive path, an antenna 110 receives downlink signals from base stations, satellites, and/or other transmitter stations and provides an RF received signal to a duplexer 112.

In the design shown in FIG. 1, duplexer 112 converts the single-ended RF received signal to differential and provides a differential LNA input signal to an LNA 130. LNA 130 amplifies the differential LNA input signal and provides a differential LNA output signal to an I downconverter 140 and a Q downconverter 150. Downconverter 140 downconverts the differential LNA output signal with a differential I LO signal from an LO generator 160 and provides a differential I downconverted signal. A lowpass filter 142 filters the differential I downconverted signal and provides a differential I baseband signal (Ibb) to a data processor 170. Similarly, downconverter 150 downconverts the differential LNA output signal with a differential Q LO signal from LO generator 160 and provides a differential Q downconverted signal. A lowpass filter 152 filters the differential Q downconverted signal and provides a differential Q baseband signal (Qbb) to data processor 170.

LO generator 160 generates the I LO signal for downconverter 140 and the Q LO signal for downconverter 150. LO generator 160 may include one or more voltage controlled oscillators (VCOs), phase locked loops (PLLs), reference oscillators, dividers, buffers, etc.

FIG. 1 shows an example receiver design. In general, the conditioning of the signals in a receiver may be performed by one or more amplifiers, filters, downconverters, etc. These circuit blocks may operate on single-ended signals or differential signals. These circuit blocks may also be arranged differently from the configuration shown in FIG. 1. Furthermore, other circuit blocks not shown in FIG. 1 may be used to condition the signals in the receiver. All or a portion of the receiver may be implemented on one or more RF integrated circuits (RFICs), analog ICs, mixed-signal ICs, etc. For example, LNA 130 and downconverters 140 and 150 may be implemented on an RFIC.

On the transmit path, data processor 170 processes data to be transmitted and provides analog I and Q signals to transmitter 122. Transmitters 122 processes (e.g., amplifies, filters, and upconverts) the analog I and Q signals to generate an RF transmit signal. The RF transmit signal is routed through duplexer 112 and transmitted via antenna 110.

Data processor 170 may include various processing units for data transmission and reception as well as other functions. For example, data processor 170 may include an analog-to-digital converter (ADC), a digital-to-analog converter (DAC), a digital signal processor (DSP), a reduced instruction set computer (RISC) processor, a central processing unit (CPU), etc. A controller/processor 180 may control the operation at wireless device 100. Memory 182 may store program codes and data for wireless device 100. Data processor 170, controller/processor 180, and/or memory 182 may be implemented on one or more application specific integrated circuits (ASICs) and/or other ICs.

Figure 2A:
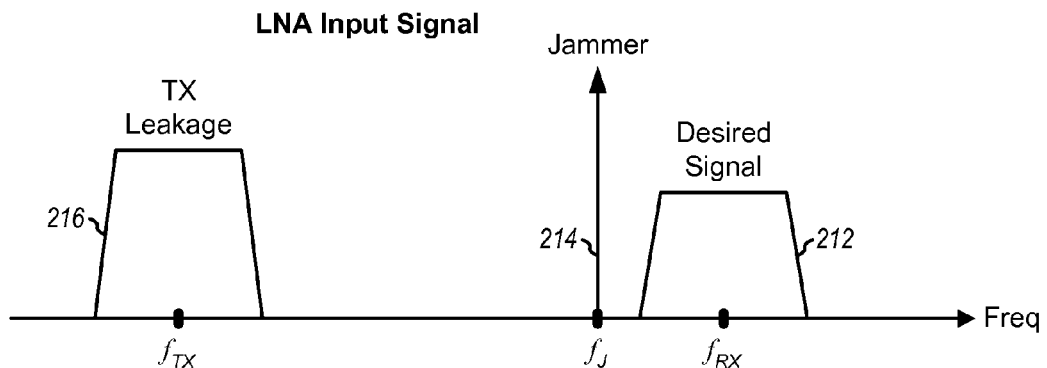
FIG. 2A shows an LNA input signal spectrum.

FIG. 2A shows a spectrum of the LNA input signal provided to LNA 130. As shown in FIG. 2A, the LNA input signal may include a desired signal 212 at a receive frequency of $f_{RX}$, a jammer 214 at a frequency of $f_J$, and a TX leakage signal 216 at a transmit frequency of $f_{TX}$. A jammer is a large amplitude undesired signal that is close in frequency to a desired signal. A jammer may come from another communication system operating in the same area. The desired signal and the jammer may be included in the RF received signal provided by antenna 110. The TX leakage signal is a portion of the RF transmit signal that couples or leaks from transmitter 122 through duplexer 112 to LNA 130. The amount of TX leakage is dependent on the amount of isolation between the transmit and receive ports of duplexer 112. The RF transmit signal may be much larger than the RF received signal. The TX leakage signal may thus be much larger than the desired signal even with good isolation between the transmit and receive ports of duplexer 112.

Figure 2B:
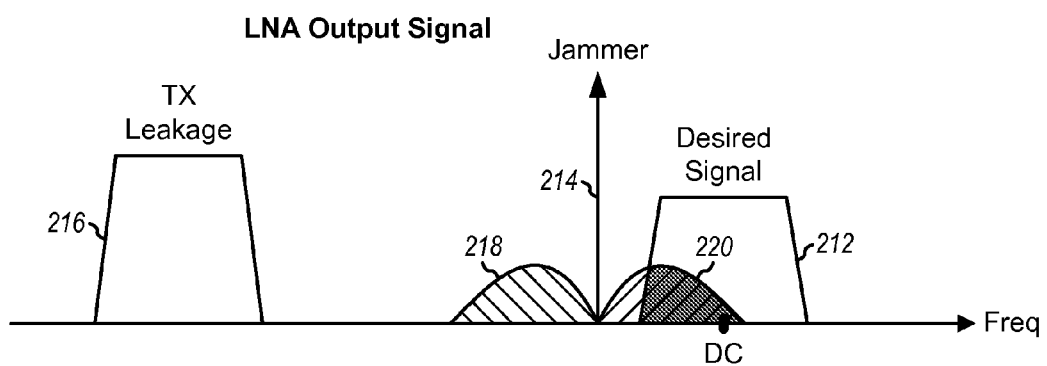
FIG. 2B shows an LNA output signal spectrum.

FIG. 2B shows a spectrum of the LNA output signal provided by LNA 130. Non-linearity of LNA 130 can cause the modulation on TX leakage signal 216 to be transferred to narrowband jammer 214, which then results in a widened spectrum 218 around the jammer. This spectral widening is referred to as inter-modulation or cross modulation. As shown in FIG. 2B, a portion 220 of widened spectrum 218 falls within the desired signal band. Portion 220 (which is shown with shading) acts as additional noise that degrades the performance of the wireless device. This noise also degrades the receiver sensitivity so that the smallest desired signal that can be reliably detected by the receiver would need to have a larger amplitude.

Good receiver performance may be obtained by keeping the inter-modulation (IM) distortion low. A very linear receiver can achieve low IM distortion by using many on-chip inductors. However, on-chip inductors occupy large silicon area, which then increases die cost. Thus, it is desirable to minimize the use of on-chip inductors. LNA 130 may use transistors instead of on-chip inductors as load. However, the load transistors may generate excessive IM distortion, which may make it difficult to meet stringent linearity requirements of CDMA and other high performance systems.

In an aspect, the external load presented to LNA 130 may be varied based on operating conditions in order to achieve good performance. LNA 130 may use PMOS transistors as internal load and may operate with a low supply voltage (e.g., 1.3 volts). The PMOS transistors may be preferred over on-chip inductors due to smaller die area and may be preferred over resistors due to low supply headroom. The distortion due to the PMOS transistors may be combated by changing the external load in order to meet stringent linearity requirements.

Distortion may be related to the load of LNA 130 as well as the input stage of LNA 130. The distortion generated by the LNA load may be due to, for example, PMOS transistors, and the output current from LNA 130 may be expressed as a function of output voltage, as follows:

$$i_{out} = g_1 \cdot V_{out} + g_2 \cdot V_{out}^2 + g_3 \cdot V_{out}^3 + \ldots, \quad \text{Eq (1)}$$

where $V_{out}$ is an output voltage provided by LNA 130,
$i_{out}$ is an output current provided by LNA 130, and
$g_1$, $g_2$ and $g_3$ are coefficients that define the linearity of LNA 130.

Equation (1) may be re-written as a function of the input voltage $V_{in}$ for LNA 130 using coefficients different from $g_1$, $g_2$ and $g_3$.

The LNA output voltage may be expressed as:

$$V_{out} = V_{desired} \cos(\omega_{desired} t) + V_{TX}(\cos(\omega_{TX1} t) + \cos(\omega_{TX2} t)) + V_J \cos(\omega_J t), \quad \text{Eq (2)}$$

where $V_{desired}$ is a desired signal voltage at frequency $\omega_{desired}$ (in radians/second),
$V_{TX}$ is a TX leakage signal voltage at frequencies $\omega_{TX1}$ and $\omega_{TX2}$, and
$V_J$ is a jammer voltage at frequency $\omega_J$.

The TX leakage components at $\omega_{TX1}$ and $\omega_{TX2}$ may represent a modulated TX leakage.

The LNA output current includes a desired current as well as inter-modulation or cross modulation distortion (CMD) currents at frequency $\omega_{TX1} - \omega_{TX2} + \omega_J$. The cross modulation distortion (CMD) is of main interest since it includes widened spectrum 218 in FIG. 2B when the modulated TX leakage is considered. The current for CMD, which is also referred to as a triple beat current, may be expressed as:

$$i_{CMD} = \frac{3}{2} g_3 \cdot V_{TX}^2 \cdot V_J = \qquad \text{Eq (3)}$$

$$\frac{3}{2} g_3 \cdot (i_{TX} \cdot Z_{mixer})^2 \cdot (i_J \cdot Z_{mixer}) = \frac{3}{2} g_3 \cdot \alpha^2 \cdot i_J^3 \cdot Z_{mixer}^3,$$

where $i_{TX}$ is the TX leakage signal current, $i_J$ is the jammer current, $i_{CMD}$ is the CMD current, $\alpha = i_{TX}/i_J$ is a fixed ratio specified by a wireless communication standard for LNA 130, and $Z_{mixer}$ is the external load observed by the output of LNA 130.

In the design shown in FIG. 1, the external load of LNA 130 is equal to the input impedance of downconverters 140 and 150. Thus, the terms "external load" and "mixer input impedance" are used interchangeably herein.

Equation (3) assumes that the external load dominates the internal load of LNA 130. This is often the case for a cascade configuration. For example, the mixer input impedance may be less than 100 ohms whereas the LNA internal load may be 1 kilo ohms or more.

As shown in equation (3), the amount of CMD current is dependent on the amount of jammer current as well as the mixer input impedance $Z_{mixer}$. Furthermore, the CMD current is proportional to $Z_{mixer}$ raised to a power of three. Thus, if $Z_{mixer}$ is reduced by a factor of two, then the CMD current is reduced by a factor of eight. The amount of CMD current may thus be controlled by varying $Z_{mixer}$.

Figure 3:
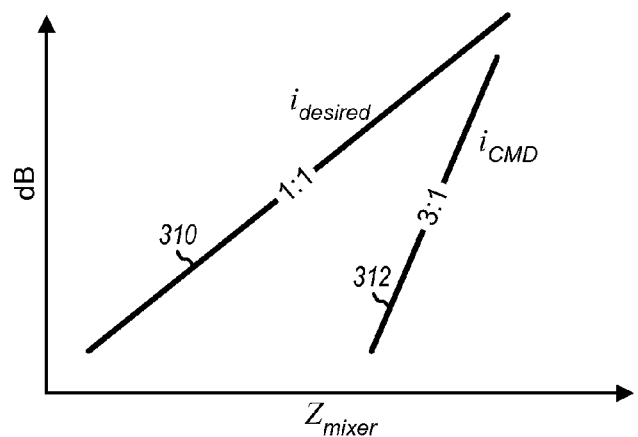
FIG. 3 shows plots of desired signal current and distortion current of an LNA versus load presented by a mixer.

FIG. 3 shows a plot 310 of the desired signal current $i_{desired}$ and a plot 312 of the CMD current $i_{CMD}$ versus mixer input impedance $Z_{mixer}$. The vertical axis shows current in logarithm scale, and the horizontal axis shows $Z_{mixer}$ in linear scale. The desired signal current has a 1:1 slope and decreases 6 dB when $Z_{mixer}$ is reduced by a factor of two. The CMD current has a 3:1 slope and decreases 18 dB when $Z_{mixer}$ is reduced by a factor of two. The CMD current thus drops at a much faster rate than the desired signal current when $Z_{mixer}$ is reduced.

Figure 4:
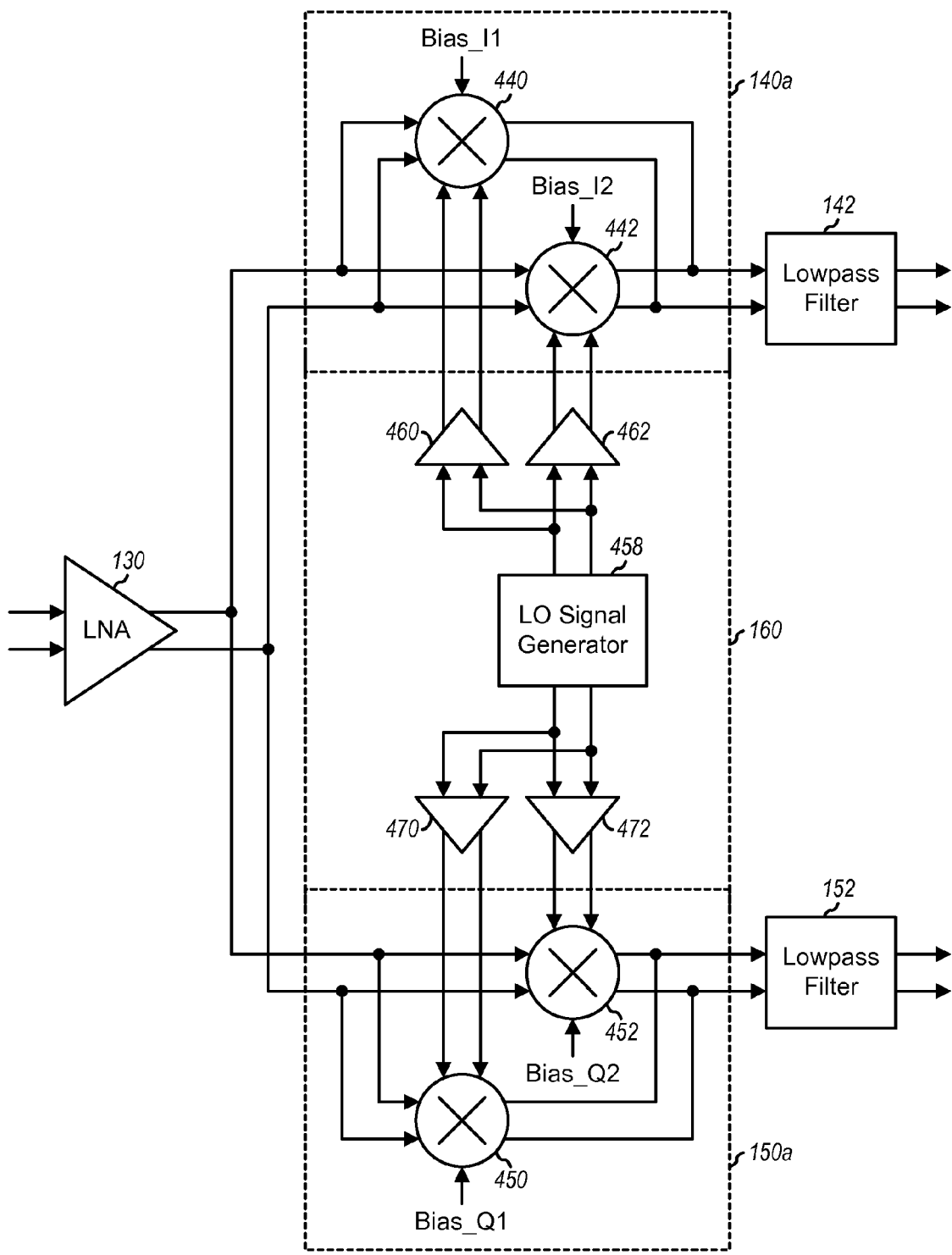
FIG. 4 shows a block diagram of an LNA and multiple pairs of mixers.

FIG. 4 shows a block diagram of a design of downconverters 140a and 150a and LO generator 160. Downconverters 140a and 150a have variable input impedance and are one design of downconverters 140 and 150, respectively, in FIG. 1.

In the design shown in FIG. 4, downconverter 140a includes a first I mixer 440 coupled in parallel with a second I mixer 442. Downconverter 150a includes a first Q mixer 450 coupled in parallel with a second Q mixer 452. LO generator 160 includes an LO signal generator 458 and four buffers 460, 462, 470 and 472. Generator 458 generates the I LO signal and the Q LO signal. Buffers 460 and 462 receive and buffer the I LO signal and provide first and second I LO signals to mixers 440 and 442, respectively. Buffers 470 and 472 receive and buffer the Q LO signal and provide first and second Q LO signals to mixers 450 and 452, respectively.

When enabled, mixer 440 downconverts the LNA output signal with the first I LO signal from buffer 460 and provides a first I downconverted signal. When enabled, mixer 442 downconverts the LNA output signal with the second I LO signal from buffer 462 and provides a second I downconverted signal. The first and second I downconverted signals are summed and provided to filter 142. When enabled, mixer 450 downconverts the LNA output signal with the first Q LO signal from buffer 470 and provides a first Q downconverted signal. When enabled, mixer 452 downconverts the LNA output signal with the second Q LO signal from buffer 472 and provides a second Q downconverted signal. The first and second Q downconverted signals are summed and provided to filter 152. Mixers 440 and 442 may be enabled or disabled by controlling their bias currents Bias_I1 and Bias_I2, respectively. Mixers 450 and 452 may be enabled or disabled by controlling their bias currents Bias_Q1 and Bias_Q2, respectively.

In one design, mixers 440 and 442 are implemented with transistors of the same size. In another design, mixers 440 and 442 are implemented with transistors of different sizes. For example, mixer 440 may be implemented with smaller transistors, and mixer 442 may be implemented with larger transistors. In one design, mixers 440 and 442 are biased with the same amount of current and/or the same bias voltage when enabled. In another design, mixers 440 and 442 are biased with different amounts of current and/or different bias voltages when enabled. For example, mixer 440 may be biased with less current or lower bias voltage when enabled, and mixer 442 may be biased with more current or higher bias voltage when enabled. In one design, mixers 440 and 442 are driven with LO signals of similar signal level. In another design, mixers 440 and 442 are driven with LO signals of different signal levels. For example, mixer 440 may be driven with a smaller LO signal, and mixer 442 may be driven with a larger LO signal. Similarly, mixers 450 and 452 may be implemented with transistors of the same or different sizes, biased with the same or different amounts of current and with the same or different bias voltages when enabled, and driven with LO signals of similar or different signal levels. LO buffers 460, 462, 470 and 472 may be scaled according to the transistor sizes of mixers 440, 442, 450 and 452, respectively.

The mixer input impedance $Z_{mixer}$ may be varied in several manners. In one design, $Z_{mixer}$ may be varied by selecting mixer 440, or mixer 442, or both mixers 440 and 442 for the I path. A lower $Z_{mixer}$ may be obtained by enabling more mixers, by selecting one or more mixers with larger transistors, etc. In another design, $Z_{mixer}$ may be varied by adjusting the bias condition of the selected mixer(s). A lower $Z_{mixer}$ may be obtained with higher bias voltage. In yet another design, $Z_{mixer}$ may be varied by adjusting the signal level of the LO signal. This may be achieved by changing LO buffers 460 and 462 (e.g., by enabling more stages in buffers 460 and 462), by changing the $V_{DD}$ supply voltage for buffers 460 and 462, etc. A lower $Z_{mixer}$ may be obtained with larger LO signal level.

In one design, a high linearity mode and a low linearity mode may be supported. The high linearity mode may be selected when a large jammer and/or high TX leakage are detected. Downconverters 140 and 150 may be operated as shown in Table 1 to obtain a low $Z_{mixer}$ for LNA 130 in the high linearity mode. This may reduce the signal swing at the LNA output so that the distortion of the PMOS transistor load is reduced. The low linearity mode may be selected when a large jammer and/or high TX leakage are not detected. Downconverters 140 and 150 may be operated as shown in Table 1 to obtain a higher $Z_{mixer}$ for LNA 130 in the low linearity mode. This may reduce parasitic capacitance presented by LNA 130, which may improve the overall noise figure of the receiver.

TABLE 1

| Mode | Description |
| --- | --- |
| High linearity mode | Enable both mixers or the mixer with larger transistors, Use larger bias voltage for the enabled mixer(s), and/or Use larger LO signal level. |
| Low linearity mode | Enable one mixer with smaller transistors, Use smaller bias voltage for the enabled mixer, and/or Use smaller LO signal level. |

In another aspect, the internal load of LNA 130 may be varied based on operating conditions in order to achieve good performance. The internal load of LNA 130 may be split into multiple sections, which may be selectively enabled based on whether large jammer and/or high TX leakage are detected.

Figure 5:
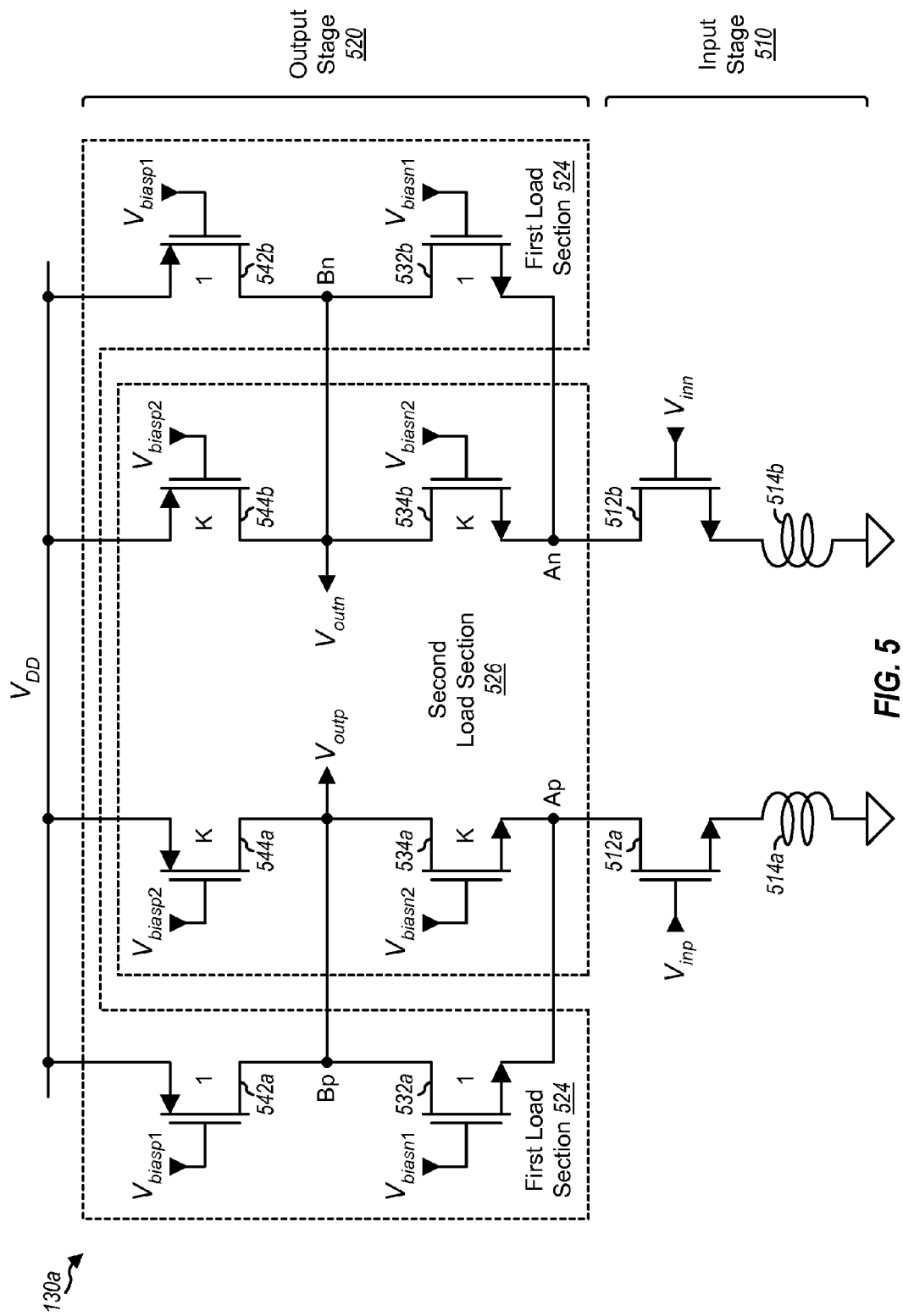
FIG. 5 shows a schematic diagram of a design of the LNA.

FIG. 5 shows a schematic diagram of an LNA 130a, which is one design of LNA 130 in FIGS. 1 and 4. LNA 130a includes an input stage 510 that provides signal amplification and an output stage 520 that provides an active load for input stage 510. Within input stage 510, an NMOS transistor 512a has its source coupled to one end of an inductor 514a, its gate receiving an LNA input signal, $V_{inp}$, and its drain coupled to node Ap. An NMOS transistor 512b has its source coupled to one end of an inductor 514b, its gate receiving a complementary LNA input signal, $V_{inn}$, and its drain coupled to node An. The other ends of inductors 514a and 514b are coupled to circuit ground. NMOS transistors 512a and 512b provide signal amplification for the differential LNA input signal, $V_{inp}$ and $V_{inn}$. The bias voltage, bias current, and size of NMOS transistors 512a and 512b may be selected to obtain the desired gain and linearity for input stage 510. Inductors 514a and 514b provide source degeneration for NMOS transistors 512a and 512b and may also provide an impedance match looking into the gates of NMOS transistors 512a and 512b.

Output stage 520 includes a first load section 524 and a second load section 526. Within output stage 520, NMOS transistors 532a and 534a are coupled in parallel and have their sources coupled to node Ap, their gates receiving $V_{biasn1}$ and $V_{biasn2}$ bias voltages, respectively, and their drains coupled to node Bp. PMOS transistors 542a and 544a are also coupled in parallel and have their sources coupled to the $V_{DD}$ supply voltage, their gates receiving $V_{biasp1}$ and $V_{biasp2}$ bias voltages, respectively, and their drains coupled to node Bp. NMOS transistors 532b and 534b are coupled in parallel and have their sources coupled to node An, their gates receiving the $V_{biasn1}$ and $V_{biasn2}$ bias voltages, respectively, and their drains coupled to node Bn. PMOS transistors 542b and 544b are also coupled in parallel and have their sources coupled to the $V_{DD}$ supply voltage, their gates receiving the $V_{biasp1}$ and $V_{biasp2}$ bias voltages, respectively, and their drains coupled to node Bn. NMOS transistors 532a, 532b, 534a and 534b provide load isolation for NMOS transistor 512a and 512b. PMOS transistors 542a, 542b, 544a and 544b provide the active load for input stage 510. The $V_{biasn1}$ and $V_{biasn2}$ bias voltages may be selected to bias NMOS transistors 532a, 534a, 532b and 534b at a desired operating point. The $V_{biasp1}$ and $V_{biasp2}$ bias voltages may be selected to bias PMOS transistors 542a, 544a, 542b and 544b at a desired operating point.

LNA 130a generates one differential LNA output signal, $V_{outp}$ and $V_{outn}$. The drains of MOS transistors 532a, 534a, 542a and 544a provide the $V_{outp}$ signal. The drains of MOS transistors 532b, 534b, 542b and 544b provide the $V_{outn}$ signal.

In the design shown in FIG. 5, MOS transistors 532a, 532b, 542a and 542b have size of 1, and MOS transistors 534a, 534b, 544a and 544b have size of K. In another design that is not shown in FIG. 5, all MOS transistors have the same size.

First load section 524 of output stage 520 includes MOS transistors 532a, 532b, 542a and 542b. Second load section 526 of output stage 520 includes MOS transistors 534a, 534b, 544a and 544b. First load section 524 may be enabled by providing the proper $V_{biasn1}$ and $V_{biasp1}$ bias voltages for MOS transistors 532a, 532b, 542a and 542b. Second load section 526 may be enabled by providing the proper $V_{biasn2}$ and $V_{biasp2}$ bias voltages for MOS transistors 534a, 534b, 544a and 544b.

In the high linearity mode, second load section 526 with larger MOS transistors or both first load section 524 and second load section 526 may be enabled in order to achieve low distortion. In the low linearity mode, only first load section 524 with smaller MOS transistors may be enabled to achieve low noise figure.

FIG. 5 shows an example design of LNA 130. An LNA may also be implemented with other designs.

In yet another aspect, both the internal and external loads of LNA 130 may be varied based on operating conditions in order to achieve good performance. This may be achieved by splitting the internal load into multiple sections and by also splitting the external load into multiple sections. The multiple sections of the internal and external loads may be selectively enabled based on whether large jammer and/or high TX leakage are detected.

Figure 6:
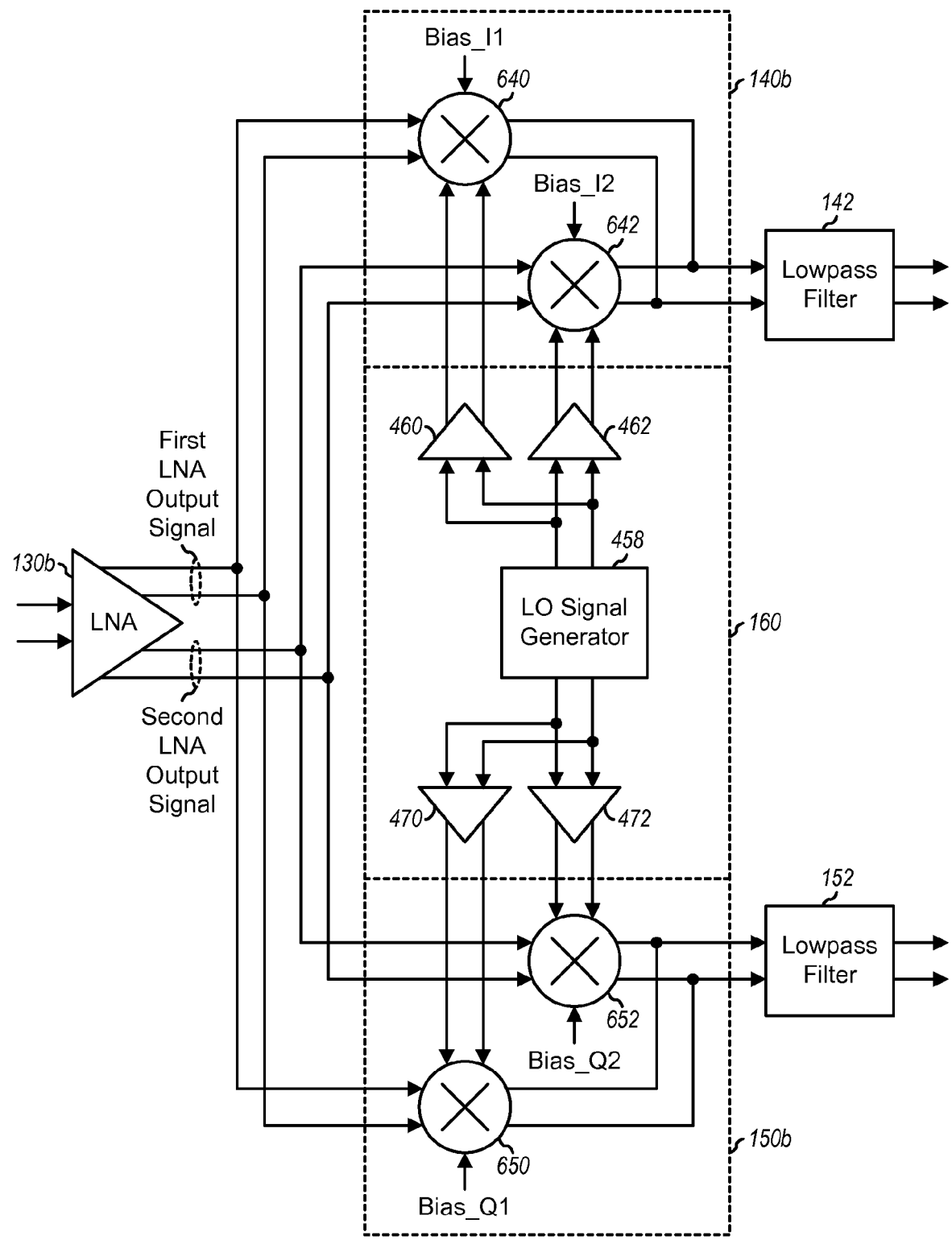
FIG. 6 shows another block diagram of the LNA and multiple pairs of mixers.

FIG. 6 shows a block diagram of a design of LNA 130b and downconverters 140b and 150b with variable input impedance. LNA 130b is another design of LNA 130 in FIG. 1. Downconverters 140b and 150b are another design of downconverters 140 and 150, respectively, in FIG. 1.

In the design shown in FIG. 6, LNA 130b receives the LNA input signal and provides first and second LNA output signals. Downconverter 140b includes a first I mixer 640 coupled in parallel with a second I mixer 642. Downconverter 150b includes a first Q mixer 650 coupled in parallel with a second Q mixer 652. When enabled, mixer 640 downconverts the first LNA output signal with the first I LO signal from buffer 460 and provides a first I downconverted signal. When enabled, mixer 642 downconverts the second LNA output signal with the second I LO signal from buffer 462 and provides a second I downconverted signal. The first and second I downconverted signals are summed and provided to filter 142. When enabled, mixer 650 downconverts the first LNA output signal with the first Q LO signal from buffer 470 and provides a first Q downconverted signal. When enabled, mixer 652 downconverts the second LNA output signal with the second Q LO signal from buffer 472 and provides a second Q downconverted signal. The first and second Q downconverted signals are summed and provided to filter 152.

Figure 7:
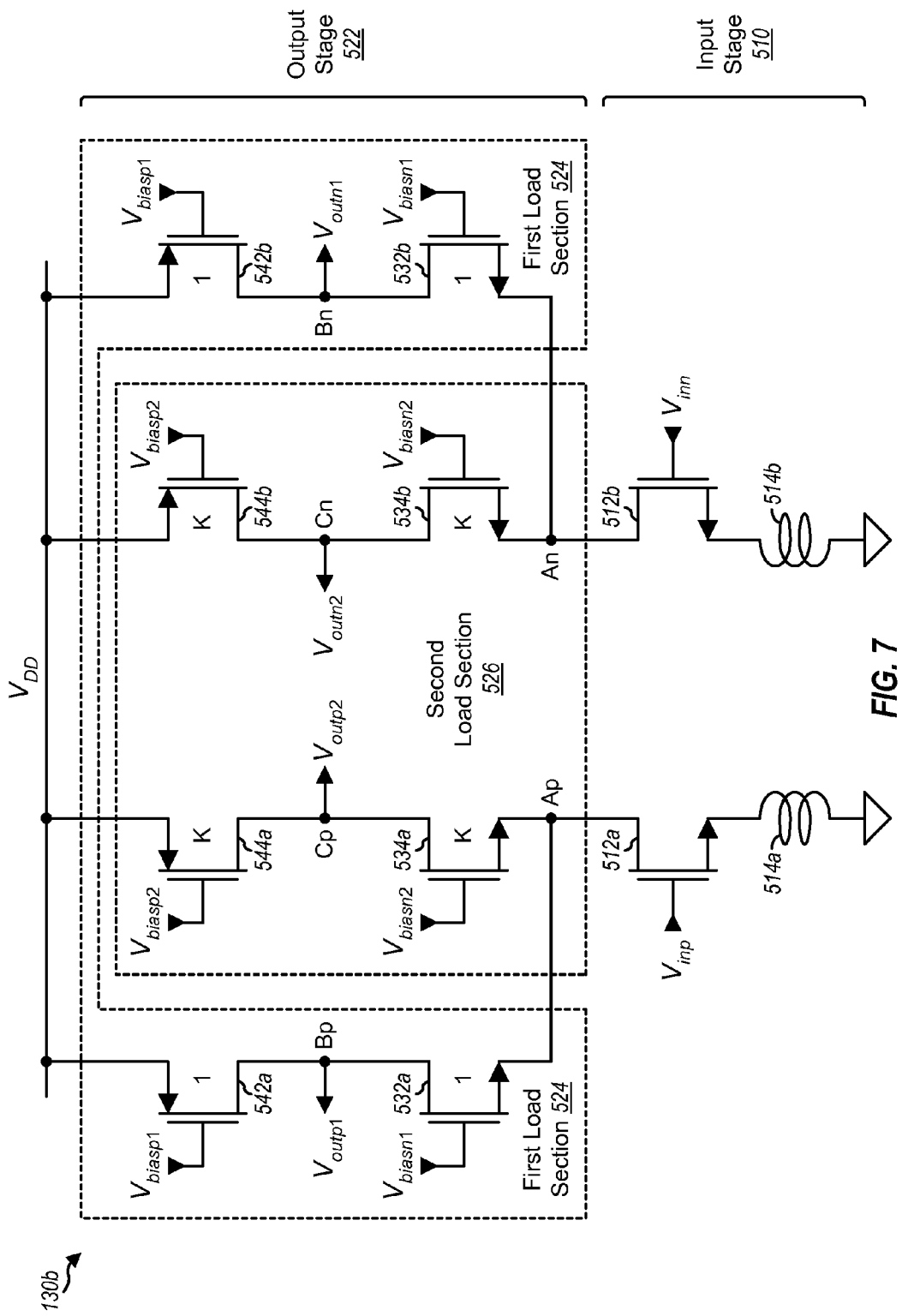
FIG. 7 shows a schematic diagram of another design of the LNA.

FIG. 7 shows a schematic diagram of a design of LNA 130b in FIG. 6. LNA 130b includes all of the circuit components in LNA 130a in FIG. 5, with the following differences. An output stage 522 includes first load section 524 and second load section 526. Within first load section 524, the drains of MOS transistors 532a and 542a are coupled to node Bp and provide a $V_{outp1}$ signal. The drains of MOS transistors 532b and 542b are coupled to node Bn and provide a $V_{outn1}$ signal. Within second load section 526, the drains of MOS transistors 534a and 544a are coupled to node Cp and provide a $V_{outp2}$ signal. The drains of MOS transistors 534b and 544b are coupled to node Cn and provide a $V_{outn2}$ signal. The first LNA output signal is composed of $V_{outp1}$ and $V_{outn1}$. The second LNA output signal is composed of $V_{outp2}$ and $V_{outn2}$.

In the designs shown in FIGS. 6 and 7, each load section within the output stage generates one LNA output signal, which drives one pair of mixers. In particular, the first LNA output signal, $V_{outp1}$ and $V_{outn1}$, from first load section 524 drives the first pair of mixers 640 and 650. The second LNA output signal, $V_{outp2}$ and $V_{outn2}$, from second load section 526 drives the second pair of mixers 642 and 652.

In one design, the first and second load sections of LNA 130b and the first and second pairs of mixers are enabled in the high linearity mode. In another design, only the second load section of LNA 130*b* with larger MOS transistors and only the second pair of mixers 642 and 652 with larger MOS transistors are enabled in the high linearity mode. For both designs, a lower load impedance may be provided for LNA 130*b*, which may then reduce the signal swing at the LNA output and reduce the distortion of the PMOS transistors.

In one design, only the first load section of LNA 130*b* with smaller MOS transistors and only the first pair of mixers 640 and 650 with smaller MOS transistors are enabled in the low linearity mode. The enabled mixers observe a higher input impedance and less parasitic capacitance presented by LNA 130*b*, which may improve the overall noise figure. Furthermore, because part of the internal load of LNA 130*b* is disabled, the noise contributed by the LNA is reduced.

Computer simulation shows improvement in noise figure by disabling the PMOS transistors for part of the output stage with the same LNA gain. Disabling part of the output stage may be feasible in the low linearity mode because lower bias current is used and the PMOS transistors that are enabled can operate with suitable saturation voltage $V_{dsat}$ even with a low supply voltage.

In the low linearity mode, the parasitic capacitance of LNA 130*b* is smaller because only one load section of the output stage is enabled. The AC coupling capacitors between LNA 130*b* and mixers 640 and 650 may be scaled accordingly. In addition, since only one pair of mixers 640 and 650 is enabled, the overall input capacitance $C_{par}$ at the mixer input may be reduced. This lower mixer input capacitance may improve the overall receiver noise figure.

Figure 8A:
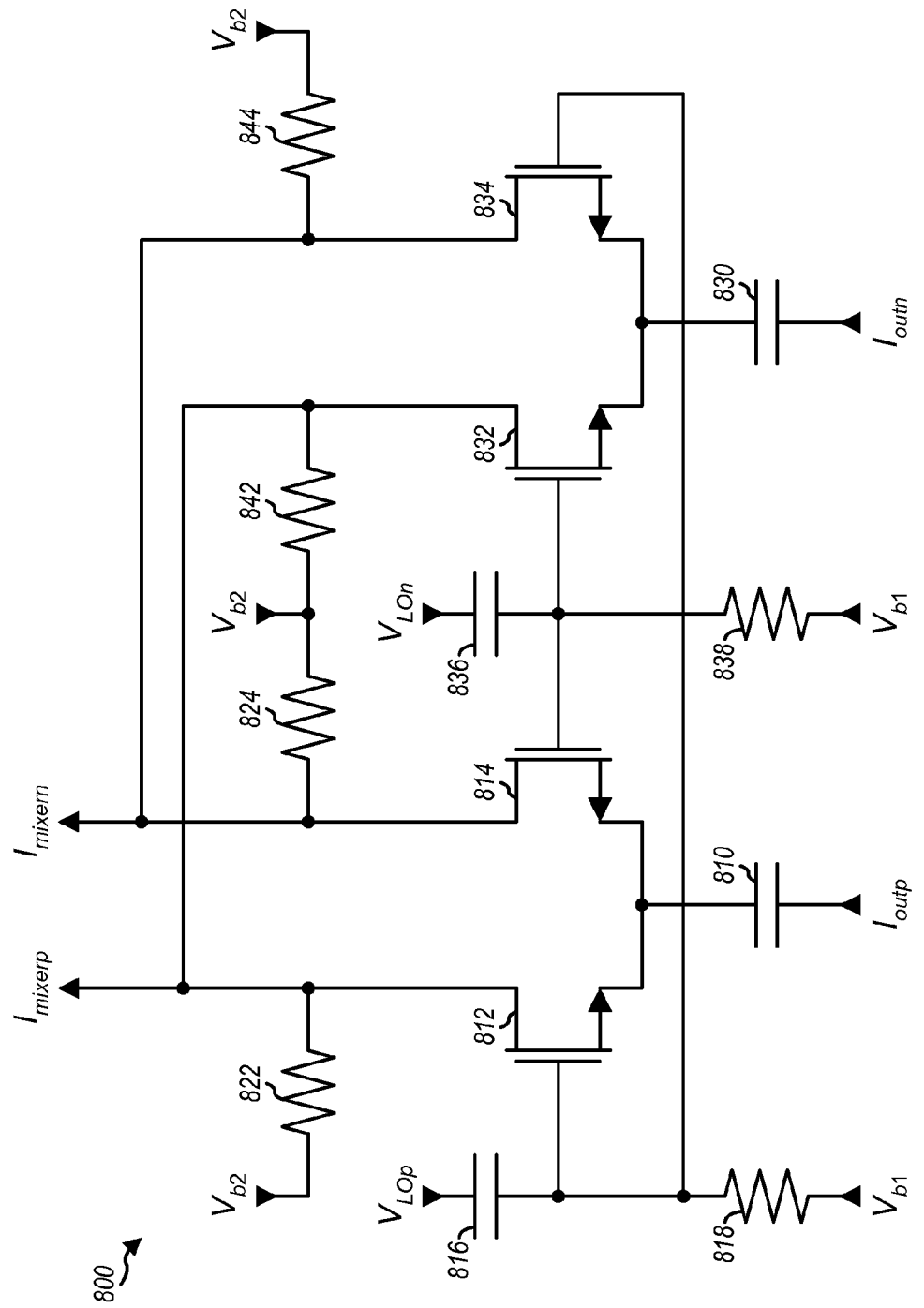
FIGS. 8A and 8B show schematic diagrams of two designs of a mixer.

FIG. 8A shows a schematic diagram of a design of a mixer 800, which may be used for each of mixers 440, 442, 450 and 452 in FIG. 4 and each of mixers 640, 642, 650 and 652 in FIG. 6.

Within mixer 800, NMOS transistors 812 and 814 form a first differential pair and have their sources coupled together, their gates receiving $V_{LOp}$ and $V_{LOn}$ LO signals via capacitors 816 and 836, respectively, and their drains providing a differential mixer output signal, $I_{mixerp}$ and $I_{mixern}$. NMOS transistors 832 and 834 form a second differential pair and have their sources coupled together, their gates receiving the $V_{LOn}$ and $V_{LOp}$ LO signals via capacitors 836 and 816, respectively, and their drains providing the $I_{mixerp}$ and $I_{mixern}$ signals, respectively. A capacitor 810 has one end receiving an $I_{outp}$ signal from LNA 130 and the other end coupled to the sources of NMOS transistors 812 and 814. A capacitor 830 has one end receiving an $I_{outn}$ signal from LNA 130 and the other end coupled to the sources of NMOS transistors 832 and 834. The $I_{outp}$ and $I_{outn}$ signals may correspond to the $V_{outp}$ and $V_{outn}$ signals in FIG. 4, the $V_{outp1}$ and $V_{outn1}$ signals in FIG. 6, or the $V_{outp2}$ and $V_{outn2}$ signals in FIG. 6.

Capacitor 816 has one end receiving the $V_{LOp}$ LO signal and the other end coupled to the gates of NMOS transistors 812 and 834. Capacitor 836 has one end receiving the $V_{LOn}$ LO signal and the other end coupled to the gates of NMOS transistors 814 and 832. The $V_{LOp}$ and $V_{LOn}$ LO signals may correspond to a differential LO signal from buffer 460, 462, 470 or 472 in FIG. 4 or from buffer 660, 662, 670 or 672 in FIG. 6.

Resistors 818 and 838 have one end coupled to a $V_{b1}$ bias voltage and the other end coupled to the gates of NMOS transistors 812 and 814, respectively. Resistors 822 and 824 have one end coupled to a $V_{b2}$ bias voltage and the other end coupled to the drains of NMOS transistors 812 and 814, respectively. Resistors 842 and 844 have one end coupled to the $V_{b2}$ bias voltage and the other end coupled to the drains of NMOS transistors 832 and 834, respectively.

Figure 8B:
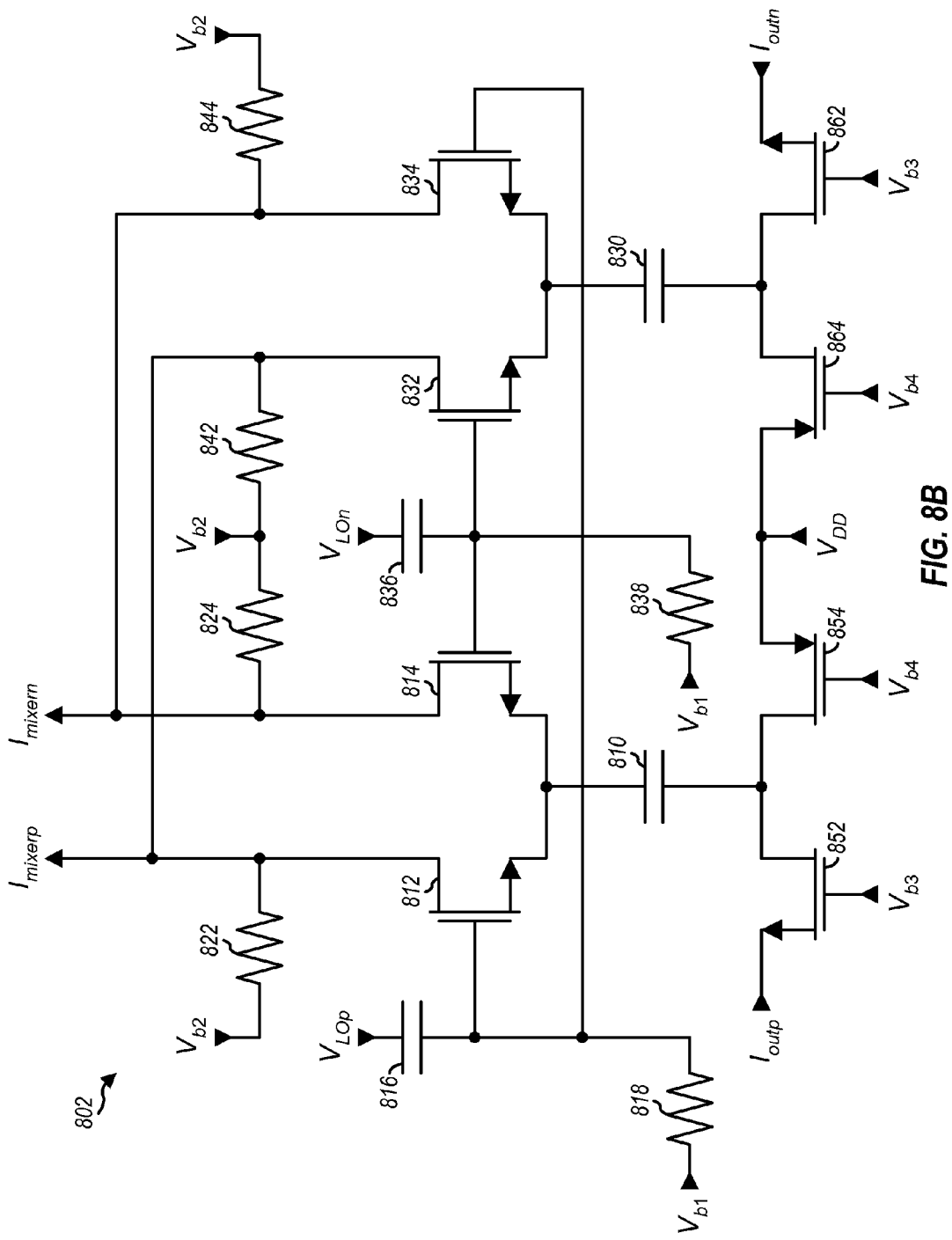

FIG. 8B shows a schematic diagram of a design of a mixer 802, which may also be used for each of mixers 440, 442, 450 and 452 in FIG. 4 and each of mixers 640, 642, 650 and 652 in FIG. 6. Mixer 802 includes all of the circuit elements in mixer 800 in FIG. 8A. Mixer 802 further includes an input current buffer for each of the $I_{outp}$ and $I_{outn}$ signals. The input current buffer for the $I_{outp}$ signal includes an input stage composed of an NMOS transistor 852 coupled in series with a PMOS load composed of a PMOS transistor 854. The input current buffer for the $I_{outn}$ signal includes an input stage composed of an NMOS transistor 862 coupled in series with a PMOS load composed of a PMOS transistor 864. An input current buffer may also be implemented with a PMOS input stage and an NMOS load. A $V_{b3}$ bias voltage may be used to adjust the bias current and input impedance of NMOS transistors 852 and 862. A $V_{b4}$ bias voltage may be used to adjust the bias voltage for PMOS transistors 854 and 864.

FIGS. 8A and 8B show two example designs of mixers 800 and 802, respectively. A mixer may also be implemented with other designs.

As shown in FIGS. 1, 4 and 6, lowpass filters 142 and 152 may filter the I and Q downconverted signals from downconverters 140 and 150, respectively. In one design, each lowpass filter includes a transmit lowpass filter followed by a baseband filter. The transmit lowpass filter may pass the desired signal and attenuate the TX leakage signal. The bandwidth of the transmit lowpass filter may be much wider than the desired signal bandwidth in order to avoid affecting the passband response. The baseband filter may be matched to the bandwidth of the desired signal.

In the designs described above, the internal load of the LNA is split into two load sections, and two pairs of I-Q mixers are used for a quadrature downconverter. In general, the internal load of the LNA may be split into any number of load sections. These multiple load sections may be implemented with the same or different transistor sizes, biased with the same or different amounts of current, and biased with the same or different bias voltages. The quadrature downconverter may also be implemented with any number of pairs of I-Q mixers. These multiple pairs of I-Q mixers may be implemented with the same or different transistor sizes, biased with the same or different amounts of current, biased with the same or different bias voltages, and driven with LO signals of the same or different signal levels.

In general, any number of modes may be supported. Each mode may be selected for certain operating conditions. Operating conditions may be quantified by jammer strength, TX leakage signal strength, and/or other parameters. Each mode may also be associated with one or more load sections and one or more pairs of I-Q mixers. A suitable mode may be selected based on the detected operating conditions. The one or more load sections and the one or more pairs of I-Q mixers for the selected mode may be enabled and used to achieve good performance. The LNA load may thus be switched according to operating conditions, e.g., according to jammer strength, TX leakage signal strength, etc.

Jammer may be detected in various manners. In one design, the power of the downconverted signal may be measured prior to the baseband filter and also after the baseband filter. The presence and strength of jammer may be determined based on the ratio of the measured power prior to the baseband filter to the measured power after the baseband filter. Jammer may also be detected by performing a fast Fourier transform (FFT) on the downconverted signal prior to the baseband filter and examining the spectral response from the FFT to determine the presence and strength of jammer. Jammer may also be detected in other manners.

Figure 9:
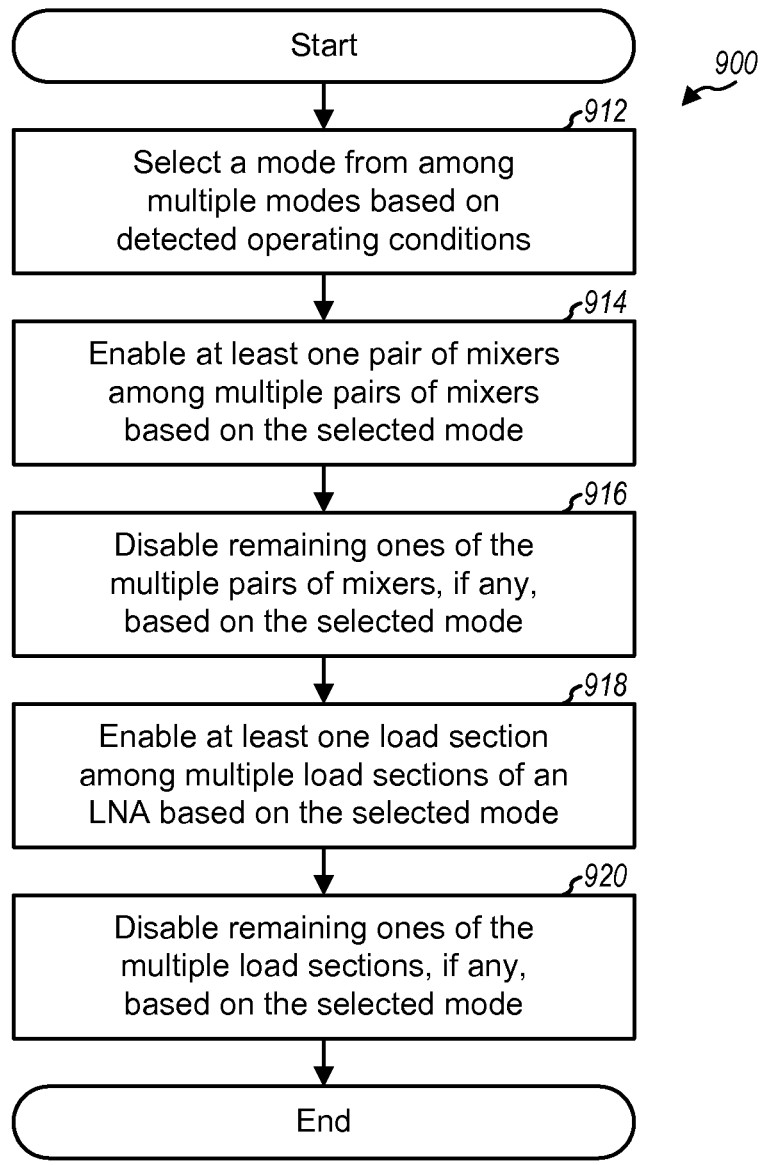
FIG. 9 shows a process for operating a receiver.

FIG. 9 shows a design of a process 900 for operating a receiver. A mode may be selected from among multiple modes based on detected operating conditions (block 912). In one design, a high linearity mode may be selected if large jammer is detected, and a low linearity mode may be selected if large jammer is not detected. Other modes may also be supported. A suitable mode may be selected based on jammer, TX leakage signal, and/or other parameters.

At least one pair of mixers among multiple pairs of mixers may be enabled based on the selected mode (block 914). Remaining ones of the multiple pairs of mixers, if any, may be disabled based on the selected mode (block 916). At least one load section among multiple load sections of an LNA may be enabled based on the selected mode (block 918). Remaining ones of the multiple load sections, if any, may be disabled based on the selected mode (block 920). In one design, the multiple pairs of mixers may include first and second pairs of mixers, and the multiple load sections may include first and second load sections. Both pairs of mixers and both load sections may be enabled if the high linearity mode is selected. The first pair of mixers and the first load section may be enabled and the second pair of mixers and the second load section may be disabled if the low linearity mode is selected. In general, any number of pairs of mixers and any number of load sections may be available, and any number of modes may be supported. Each mode may be associated with at least one pair of mixers and at least one load section to enable for that mode.

The LNA and mixers described herein may provide certain advantages. First, high linearity may be achieved without using on-chip inductors as LNA load, which may provide significant cost saving, especially for a wireless device supporting multiple systems and/or multiple frequency bands. Second, the techniques may allow for removal of a surface acoustic wave (SAW) filter between the LNA and mixers, which may also provide cost saving and other benefits. SAW filters are commonly used between the LNA and mixers in wireless devices for CDMA in order to attenuate the TX leakage signal. The improved linearity with the techniques described herein may allow the LNA to be coupled directly to the mixers, as shown in FIGS. 1, 4 and 6. Third, the techniques may reduce LO re-radiation because of the elimination of on-chip inductors for LNA load.

The LNA and mixers described herein may be implemented on an IC, an analog IC, an RFIC, a mixed-signal IC, an ASIC, a printed circuit board (PCB), an electronics device, etc. The LNA and mixers may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), etc.

An apparatus implementing the LNA and mixers described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a low noise amplifier (LNA) configured to receive an LNA input signal and provide at least one LNA output signal, wherein the LNA comprises a plurality of N-channel metal oxide semiconductor (NMOS) transistors connected in parallel, and a separate plurality of NMOS transistors and a plurality of P-channel metal oxide semiconductor (PMOS) transistors; and
multiple pairs of mixers coupled to the LNA, each pair of mixers configured to downconvert one LNA output signal when enabled, each pair of mixers being selectively enabled or disabled;
wherein the multiple pairs of mixers have variable mixer input impedance, and selective enabling and disabling of each pair of mixers increases apparatus linearity by varying mixer input impedance.

2. The apparatus of claim 1, wherein the multiple pairs of mixers comprise first and second pairs of mixers implemented with transistors of different sizes.

3. The apparatus of claim 1, wherein the multiple pairs of mixers comprise first and second pairs of mixers biased with different amounts of current or different bias voltages.

4. The apparatus of claim 1, wherein the multiple pairs of mixers comprise first and second pairs of mixers driven with local oscillator (LO) signals of different signal levels.

5. The apparatus of claim 1, wherein the multiple pairs of mixers have outputs coupled together and providing a downconverted signal.

6. The apparatus of claim 1, wherein each pair of mixers is enabled or disabled based on a mode selected from among multiple modes, each mode being associated with a different set of at least one pair of mixers, and wherein the at least one pair of mixers associated with the selected mode is enabled and all remaining pairs of mixers, if any, are disabled.

7. The apparatus of claim 1, wherein the first and second pairs of mixers are enabled for a high linearity mode, and wherein the first pair of mixers is enabled and the second pair of mixers is disabled for a low linearity mode.

8. The apparatus of claim 7, wherein the high linearity mode is selected when a large jammer is detected and the low linearity mode is selected when a large jammer is not detected.

9. The apparatus of claim 1, wherein the LNA is configured to provide a single LNA output signal, and wherein each pair of mixers is configured to downconvert the LNA output signal when enabled.

10. The apparatus of claim 1, wherein the LNA is configured to provide multiple LNA output signals, one LNA output signal for each pair of mixers, and wherein each pair of mixers is configured to downconvert a respective LNA output signal when enabled.

11. The apparatus of claim 1, wherein the LNA is configured to provide first and second LNA output signals, wherein the first pair of mixers is configured to downconvert the first LNA output signal when enabled, and wherein the second pair of mixers is configured to downconvert the second LNA output signal when enabled.

12. An apparatus comprising:
a low noise amplifier (LNA) comprising an input stage and an output stage, the input stage receiving an LNA input signal and providing an amplified signal, the output stage buffering the amplified signal and providing at least one LNA output signal, the output stage comprising multiple load sections coupled in parallel, each load section configured to be selectively enabled or disabled;
wherein the apparatus is configured to vary internal and external loads of the LNA by selectively enabling and disabling each load section;
wherein the input stage comprises a plurality of N-channel metal oxide semiconductor (NMOS) transistors connected in parallel and each load section comprises a plurality of NMOS transistors and a plurality of P-channel metal oxide semiconductor (PMOS) transistors.

13. The apparatus of claim 12, wherein each of the multiple load sections comprises a pair of P-channel metal oxide semiconductor (PMOS) transistors coupled to a pair of N-channel metal oxide semiconductor (NMOS) transistors.

14. The apparatus of claim 12, wherein the multiple load sections are implemented with transistors of different sizes.

15. The apparatus of claim 12, wherein the multiple load sections are biased with different amounts of current or different bias voltages.

16. The apparatus of claim 12, wherein the multiple load sections are configured to provide multiple LNA output signals, one LNA output signal for each load section.

17. The apparatus of claim 12, wherein the multiple load sections comprise first and second load sections, wherein the first and second load sections are enabled for a high linearity mode, and wherein the first load section is enabled and the second load section is disabled for a low linearity mode.

18. An apparatus comprising:
a low noise amplifier (LNA) configured to receive an LNA input signal and provide multiple LNA output signals, wherein the LNA comprises a plurality of N-channel metal oxide semiconductor (NMOS) transistors connected in parallel, and a separate plurality of NMOS transistors and a plurality of P-channel metal oxide semiconductor (PMOS) transistors; and
multiple pairs of mixers coupled to the LNA, each pair of mixers configured to downconvert a different one of the multiple LNA output signals when enabled;
wherein the multiple pairs of mixers have variable mixer input impedance, and selective enabling and disabling of each pair of mixers increases apparatus linearity by varying mixer input impedance.

19. The apparatus of claim 18, wherein each pair of mixers is enabled or disabled based on a mode selected from among multiple modes.

20. The apparatus of claim 19, wherein the LNA comprises multiple load sections configured to provide the multiple LNA output signals, each load section being enabled or disabled based on the selected mode.

21. The apparatus of claim 18, wherein the LNA comprises first and second load sections configured to provide first and second LNA output signals for the first and second pairs of mixers, respectively.

22. The apparatus of claim 21, wherein the first and second load sections and the first and second pairs of mixers are enabled for a high linearity mode, and wherein the first load section and the first pair of mixers are enabled and the second load section and the second pair of mixers are disabled for a low linearity mode.

23. An integrated circuit comprising:
a low noise amplifier (LNA) configured to receive an LNA input signal and provide at least one LNA output signal, wherein the LNA comprises a plurality of N-channel metal oxide semiconductor (NMOS) transistors connected in parallel, and a separate plurality of NMOS transistors and a plurality of P-channel metal oxide semiconductor (PMOS) transistors; and
multiple pairs of mixers coupled to the LNA, each pair of mixers configured to downconvert one of the at least one LNA output signal when enabled, each pair of mixers being selectively enabled or disabled;
wherein the multiple pairs of mixers have variable mixer input impedance, and selective enabling and disabling of each pair of mixers increases integrated circuit linearity by varying mixer input impedance.

24. The integrated circuit of claim 23, wherein the first and second pairs of mixers are enabled for a high linearity mode, and wherein the first pair of mixers is enabled and the second pair of mixers is disabled for a low linearity mode.

25. The integrated circuit of claim 23, wherein the LNA comprises multiple load sections coupled in parallel, each load section being selectively enabled or disabled.

26. The integrated circuit of claim 25, wherein the multiple load sections comprise first and second load sections, wherein the first and second load sections are enabled for a high linearity mode, and wherein the first load section is enabled and the second load section is disabled for a low linearity mode.

27. The integrated circuit of claim 25, wherein the multiple load sections comprise first and second load sections, wherein the first and second load sections and the first and second pairs of mixers are enabled for a high linearity mode, and wherein the first load section and the first pair of mixers are enabled and the second load section and the second pair of mixers are disabled for a low linearity mode.

28. A method of operating a receiver, comprising:
selecting a mode from among multiple modes based on detected operating conditions;
enabling at least one pair of mixers among multiple pairs of mixers based on the selected mode;
disabling remaining ones of the multiple pairs of mixers, if any, based on the selected mode;
enabling at least one load section among multiple load sections of a low noise amplifier (LNA) based on the selected mode, wherein the LNA comprises a plurality of N-channel metal oxide semiconductor (NMOS) transistors connected in parallel, and a separate plurality of NMOS transistors and a plurality of P-channel metal oxide semiconductor (PMOS) transistors; and disabling remaining ones of the multiple load sections, if any, based on the selected mode.

29. The method of claim 28, wherein the enabling at least one pair of mixers and the disabling remaining ones of the multiple pairs of mixers comprise enabling the first and second pairs of mixers if a high linearity mode is selected, and enabling the first pair of mixers and disabling the second pair of mixers if a low linearity mode is selected.

30. The method of claim 28, wherein the multiple load sections comprise first and second load sections, and wherein the enabling at least one load section and the disabling remaining ones of the multiple load sections comprise enabling the first and second load sections if a high linearity mode is selected, and enabling the first load section and disabling the second load section if a low linearity mode is selected.

31. The method of claim 28, wherein the selecting a mode comprises detecting for large jammer, selecting a high linearity mode if large jammer is detected, and selecting a low linearity mode if large jammer is not detected.

32. An apparatus comprising:
    means for selecting a mode from among multiple modes based on detected operating conditions;
    means for enabling at least one pair of mixers among multiple pairs of mixers based on the selected mode; and
    means for disabling remaining ones of the multiple pairs of mixers, if any, based on the selected mode;
    means for enabling at least one load section among multiple load sections of a low noise amplifier (LNA) based on the selected mode, wherein the LNA comprises a plurality of N-channel metal oxide semiconductor (NMOS) transistors connected in parallel, and a separate plurality of NMOS transistors and a plurality of P-channel metal oxide semiconductor (PMOS) transistors; and
    means for disabling remaining ones of the multiple load sections, if any, based on the selected mode.

33. The apparatus of claim 32, wherein the means for enabling at least one pair of mixers and the means for disabling remaining ones of the multiple pairs of mixers comprise means for enabling the first and second pairs of mixers if a high linearity mode is selected, and means for enabling the first pair of mixers and disabling the second pair of mixers if a low linearity mode is selected.

34. The apparatus of claim 32, wherein the multiple load sections comprise first and second load sections, and wherein the means for enabling at least one load section and the means for disabling remaining ones of the multiple load sections comprise means for enabling the first and second load sections if a high linearity mode is selected, and means for enabling the first load section and disabling the second load section if a low linearity mode is selected.

35. The apparatus of claim 32, wherein the means for selecting a mode comprises means for detecting for large jammer, means for selecting a high linearity mode if large jammer is detected, and means for selecting a low linearity mode if large jammer is not detected.

36. A computer program product embodied with executable instructions, the executable instructions comprising:
    code for causing at least one computer to select a mode from among multiple modes based on detected operating conditions;
    code for causing the at least one computer to enable at least one pair of mixers among multiple pairs of mixers based on the selected mode; and
    code for causing the at least one computer to disable remaining ones of the multiple pairs of mixers, if any, based on the selected mode;
    code for enabling at least one load section among multiple load sections of a low noise amplifier (LNA) based on the selected mode, wherein the LNA comprises a plurality of N-channel metal oxide semiconductor (NMOS) transistors connected in parallel, and a separate plurality of NMOS transistors and a plurality of P-channel metal oxide semiconductor (PMOS) transistors; and
    code for disabling remaining ones of the multiple load sections, if any, based on the selected mode.

37. The computer program product of claim 36, wherein the code for enabling at least one pair of mixers and the code for disabling remaining ones of the multiple pairs of mixers comprise code for enabling the first and second pairs of mixers if a high linearity mode is selected, and code for enabling the first pair of mixers and disabling the second pair of mixers if a low linearity mode is selected.

* * * * *